(12) United States Patent
Nie et al.

(10) Patent No.: US 11,410,738 B1
(45) Date of Patent: Aug. 9, 2022

(54) WORD LINE DECODING CIRCUIT AND MEMORY

(71) Applicant: CHINA FLASH CO., LTD., Shanghai (CN)

(72) Inventors: Hong Nie, Shanghai (CN); Zeyu Zhu, Shanghai (CN); Yue Zhao, Shanghai (CN); Ying Sun, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/566,643

(22) Filed: Dec. 30, 2021

(30) Foreign Application Priority Data

Jun. 17, 2021 (CN) .......................... 202110669338.6

(51) Int. Cl.
| | |
|---|---|
| *G11C 5/00* | (2006.01) |
| *G11C 16/34* | (2006.01) |
| *G11C 16/14* | (2006.01) |
| *G11C 16/10* | (2006.01) |
| *H03K 19/0948* | (2006.01) |
| *G11C 16/08* | (2006.01) |
| *G11C 16/30* | (2006.01) |
| *G11C 16/04* | (2006.01) |
| *G11C 16/26* | (2006.01) |

(52) U.S. Cl.
CPC ...... *G11C 16/3409* (2013.01); *G11C 16/0433* (2013.01); *G11C 16/08* (2013.01); *G11C 16/102* (2013.01); *G11C 16/14* (2013.01); *G11C 16/26* (2013.01); *G11C 16/30* (2013.01); *G11C 16/344* (2013.01); *H03K 19/0948* (2013.01)

(58) Field of Classification Search
CPC .... G11C 8/10; G11C 8/08; G11C 8/12; G11C 8/14; G11C 11/4085
USPC ............................................... 365/230.06, 63
See application file for complete search history.

(56) References Cited

U.S. PATENT DOCUMENTS

| | | | |
|---|---|---|---|
| 8,854,913 B2 * | 10/2014 | Jang .......................... | G11C 8/10 365/230.06 |
| 9,406,375 B1 * | 8/2016 | Barowski .............. | G11C 11/418 |

(Continued)

FOREIGN PATENT DOCUMENTS

| | | |
|---|---|---|
| CN | 1164926 A | 11/1997 |
| CN | 1479317 A | 3/2004 |

(Continued)

*Primary Examiner* — Son T Dinh
(74) *Attorney, Agent, or Firm* — Global IP Services; Tianhua Gu

(57) ABSTRACT

A word line decoding circuit and memory comprises a first address decoding module to obtain word line logic signals; a word line pre-coding module to obtain word line pre-coding signals and first switch signals; a second address decoding module to obtain first and second selection signals; a third address decoding module to obtain third selection signals; a first level conversion module which performs level conversion on the first selection signals to obtain first and second control signals; a second level conversion module which performs level conversion on the second selection signals to get third and fourth control signals; a third level conversion module which performs level conversion on the third selection signals to obtain fifth control signals; a word line toggle switch signal generation module which generates second switch signals based on each control signal; and a word line toggle module to generate word line signals.

12 Claims, 4 Drawing Sheets

(56) References Cited

U.S. PATENT DOCUMENTS

2004/0230736 A1  11/2004  Leconte et al.
2014/0269140 A1   9/2014  Sanjeevarao et al.
2018/0233204 A1   8/2018  Lee

FOREIGN PATENT DOCUMENTS

| CN | 1744232 A | 3/2006 |
| CN | 1985330 A | 6/2007 |
| CN | 101079323 A | 11/2007 |
| CN | 101471133 A | 7/2009 |
| CN | 104658604 A | 5/2015 |
| CN | 112652337 A | 4/2021 |
| CN | 112652338 A | 4/2021 |

\* cited by examiner

|  | HVL_IN | NVL_IN |
|---|---|---|
| programing/reading | VH | GND |
| erase | VDD | VN |
| over-erase detection | VDD | VN |

FIG. 4

|  |  | WL_LOGIC | PG_SEL | NG_SEL | LS_SEL | WL_PRE | NGATE |
|---|---|---|---|---|---|---|---|
| programing/reading | selected | logic1 | logic1 | logic1 | logic1 | HVL_IN | NVL_IN |
|  | unselected | logic0 | logic0 | logic1 | logic0 | NVL_IN | HVL_IN |
| erase | selected | logic0 | logic1 | logic1 | logic0 | GND | NVL_IN |
|  | unselected | logic0 | logic0 | logic0 | logic1 | GND | NVL_IN |
| over-erase detection | selected | logic0 | logic1 | logic1 | logic1 | GND | NVL_IN |
|  | unselected | logic1 | logic0 | logic1 | logic0 | NVL_IN | HVL_IN |

FIG. 5

| PG_SEL | NG_SEL | LS_SEL | LS_OUT | PG_OUT | ND2 | NG_OUT | PS0 | NPGATE |
|---|---|---|---|---|---|---|---|---|
| logic0 | logic0 | logic0 | NVL_IN | NVL_IN | floating | HVL_IN | floating | NVL_IN |
| logic0 | logic0 | logic1 | HVL_IN | NVL_IN | floating | HVL_IN | floating | NVL_IN |
| logic0 | logic1 | logic0 | NVL_IN | NVL_IN | floating | NVL_IN | HVL_IN | HVL_IN |
| logic0 | logic1 | logic1 | HVL_IN | NVL_IN | floating | NVL_IN | HVL_IN | HVL_IN |
| logic1 | logic0 | logic0 | NVL_IN | HVL_IN | NVL_IN | HVL_IN | floating | NVL_IN |
| logic1 | logic0 | logic1 | HVL_IN | HVL_IN | NVL_IN | HVL_IN | floating | NVL_IN |
| logic1 | logic1 | logic0 | NVL_IN | HVL_IN | NVL_IN | NVL_IN | HVL_IN | HVL_IN |
| logic1 | logic1 | logic1 | HVL_IN | HVL_IN | NVL_IN | NVL_IN | HVL_IN | NVL_IN |

FIG. 6

|  |  | PG_OUT | ND2 | NG_OUT | PS0 | NPGATE | WL_PRE | NGATE |
|---|---|---|---|---|---|---|---|---|
| programing/reading | selected | VH | GND | GND | VH | GND | VH | GND |
|  | unselected | GND | floating | GND | VH | VH | GND | VH |
| erase | selected | VDD | VN | VN | VDD | VDD | GND | VN |
|  | unselected | VN | floating | VDD | floating | VN | GND | VN |
| over-erase detection | selected | VDD | VN | VN | VDD | VN | GND | VN |
|  | unselected | VN | floating | VN | VDD | VDD | VN | VDD |

FIG. 7

WORD LINE DECODING CIRCUIT AND MEMORY

CROSS REFERENCE TO RELATED APPLICATION

The present application claims the benefit of priority to Chinese Patent Application No. CN 2021106693386, entitled "WORD LINE DECODING CIRCUIT AND MEMORY", filed with CNIPA on Jun. 17, 2021, the disclosure of which is incorporated herein by reference in its entirety for all purposes.

FIELD OF TECHNOLOGY

The present disclosure generally relates to the field of semiconductor storage technology, and in particular to a word line decoding circuit and memory.

BACKGROUND

The rapid development and widespread use of modern electronic devices and embedded structures have led to an increasing demand for highly integrated circuit chips, which has given rise to a series of requirements on the area of integrated circuit chips. For storage devices, reducing the chip area of FLASH memory has been the goal pursued by high-capacity or even very large-capacity FLASH memory chips.

Non-volatile memory requires a positive high voltage for selected word lines during programming and reading operations, and a negative high voltage for the selected word lines during erase operations. Take $n=2^a$ as an example, wherein a is a natural number, for line decoding circuit to generate n word lines with a positive high voltage or negative high voltage, n/4 word line toggle switches are required. Then these word line toggle switches must also be provided with a positive high voltage or negative high voltage. For conventional designs, each word line toggle switch requires its own level conversion circuit. Then n/4 level conversion circuits are needed; the larger the product capacity, the more word line toggle switches are needed; the more level conversion circuits are needed, and the larger the chip area is, which is not conducive to miniaturization and cost reduction.

Therefore, how to further reduce the memory area and reduce costs has become an urgent problem to be solved by people skilled in the field.

SUMMARY

In view of the above-mentioned disadvantages, the present disclosure aims to provide a line decoding circuit and memory for solving the problems of large memory area and high cost in the prior art.

To achieve the above and other related purposes, the present disclosure provides a word line decoding circuit, the line decoding circuit comprising at least:

a first address decoding module, receiving first to Jth address signals and decoding them to obtain word line logic signals;

a word line pre-coding module, connected to outputs of the first address decoding module, decoding the word line logic signals based on a low voltage source and/or a high voltage source to obtain word line pre-coding signals and first switch signals;

a second address decoding module, receiving (J+1)th to (M+2)th address signals and decoding them to obtain first selection signals and second selection signals;

a third address decoding module, receiving (M+3)th to $(\log_2 n)$th address signals and decoding them to obtain third selection signals;

a first level conversion module, connected to outputs of the second address decoding module, wherein the first level conversion module performs level conversion on the first selection signals based on the low voltage source and/or the high voltage source to obtain first control signals and second control signals;

a second level conversion module, connected to outputs of the second address decoding module, wherein the second level conversion module performs level conversion on the second selection signals based on the low voltage source and/or the high voltage source to obtain third control signals and fourth control signals;

a third level conversion module, connected to outputs of the third address decoding module, wherein the third level conversion module performs level conversion on the third selection signals based on the low voltage source and/or the high voltage source to obtain fifth control signals;

a word line toggle switch signal generation module, connected to outputs of the first level conversion module, the second level conversion module, and the third level conversion module, generating second switch signals based on the first control signals, the second control signals, the third control signals, the fourth control signals, and the fifth control signals a word line toggle module, connected to outputs of the word line pre-coding module and the word line toggle switch signal generation module, generating k word line signals based on the first switch signals and the second switch signals;

wherein if $k=2^a$, then k=n; if $k \neq 2^a$, then $n/2 < k < n$; wherein $n=2^a$, a is a natural number, J is a natural number between 1 and M+1, and M is any natural number.

Optionally, the line decoding circuit further comprises a high/negative voltage toggle module, wherein the high/negative voltage toggle module receives negative and positive voltages, and switches between outputting a high voltage and outputting a low voltage with corresponding voltage values based on operation modes.

More optionally, the positive voltages range from 5V to 9.5V and the negative voltages ranges from −8V to −9.75V.

Optionally, the word line toggle switch signal generation module comprises a plurality of word line toggle switch signal generation units, each word line toggle switch signal generation unit comprising a first PMOS, a second PMOS, a first NMOS, and a second NMOS.

The first PMOS and the first NMOS have gates connected to the fifth control signals, the first PMOS has a source connected to the third control signals, the first NMOS has a source connected to the first control signals, the second PMOS has a source connected to the third control signals, a gate connected to the second control signals a drain connected to drains of the first PMOS and the first NMOS; the second NMOS has a gate connected to the fourth control signals and a source connected to the low voltage source; the drains of the first PMOS, the second PMOS, the first NMOS and the second NMOS are connected together and output switch signals.

More optionally, during programming and reading operations:

in a word line toggle switch signal generation unit corresponding to a selected word line, gates of the corresponding first PMOS and first NMOS, a source of the corresponding first PMOS, and a gate and source of the second PMOS receive a positive high voltage, a source of the first NMOS, and a gate and source of the second NMOS are grounded, and outputs of the corresponding word line toggle switch signal generation unit are grounded;

in a word line toggle switch signal generation unit corresponding to an unselected word line, sources of the corresponding first PMOS and second PMOS receive a positive high voltage, gates of the corresponding first PMOS, first NMOS, and second PMOS, and a gate and source of the corresponding second NMOS are grounded, the source of the first NMOS is floating, and the corresponding word line toggle switch signal generation unit outputs a positive high voltage.

More optionally, during erase operations:

in a word line toggle switch signal generation unit corresponding to a selected word line, a source of the corresponding first PMOS, a source and gate of the corresponding second PMOS receive a supply voltage, a gate of the corresponding first PMOS and first NMOS, a source of the first NMOS, a gate and source of the corresponding second NMOS receive a negative high voltage, and the corresponding word line toggle switch signal generation unit outputs the supply voltage.

in a word line toggle switch signal generation unit corresponding to an unselected word line, gates of the corresponding first PMOS, first NMOS, and second NMOS receive the supply voltage, a gate of the corresponding second PMOS, a source of the second NMOS receive a negative high voltage, sources of the first PMOS, second PMOS, and first NMOS are floating, the corresponding word line toggle switch signal generation unit outputs a negative high voltage.

More optionally, during over-erase operations:

in a word line toggle switch signal generation unit corresponding to a selected word line, gates of the corresponding first PMOS, first NMOS, and second PMOS, sources of the first PMOS and the second PMOS receive a supply voltage, a source of the first NMOS, a gates and source of the corresponding second NMOS receive a negative high voltage, and the corresponding word line toggle switch signal generation unit outputs a negative high voltage.

in a word line toggle switch signal generation unit corresponding to an unselected word line, sources of the corresponding first PMOS and second PMOS receive a supply voltage, gates of the first PMOS, the corresponding first NMOS, and the second PMOS, and a gate and source of the corresponding second NMOS receive a negative high voltage, a source of the first NMOS is floating, the corresponding word line toggle switch signal generation unit outputs a supply voltage.

Optionally, the word line toggle module comprises k word line switching units, each word line switching unit comprising a third PMOS, a third NMOS, and a fourth NMOS.

The third PMOS has a source connected to the word line pre-decoding signals and a gate connected to the second switch signals; the third NMOS has a source connected to the low voltage source and a gate connected to the second switch signals; the fourth NMOS has a source connected to the low voltage source and a gate connected to the first switch signals; drains of the third PMOS, the third NMOS, and the fourth NMOS are connected together and output word line signals.

More optionally, during programming and reading operations:

in a word line switching unit corresponding to a selected word line, a source of the corresponding third PMOS receives a positive high voltage, a gate of the third PMOS, a gate and source of the corresponding third NMOS, and a gate and source of the corresponding fourth NMOS are grounded, and the corresponding word line switching unit outputs a positive high voltage;

in a word line switching unit corresponding to an unselected word line, gates of the corresponding third PMOS, third NMOS, and fourth NMOS receive a positive high voltage, sources of the third PMOS, third NMOS, and fourth NMOS are grounded, and outputs of the corresponding word line switching unit are grounded; or, the gates and sources of the third PMOS and third NMOS, and the source of the fourth NMOS are grounded, the gate of the fourth NMOS receives a positive high voltage, the outputs of the corresponding word line switching unit output are grounded; or, the gate and source of the third PMOS, and the gate of the third NMOS receives a positive high voltage, the source of the third NMOS, and the gate and source of the fourth NMOS are grounded, and the outputs of the corresponding word line switching unit are grounded.

More optionally, during erase operations:

in a word line switching unit corresponding to a selected word line, a source of the corresponding third PMOS is grounded, the gate of the third PMOS, and the gate of the corresponding third NMOS receive a supply voltage, the source of the third NMOS, a gate and source of the corresponding fourth NMOS receive a negative high voltage, and the corresponding word line switching unit outputs a negative high voltage;

in a word line switching unit corresponding to an unselected word line, a source of the corresponding third PMOS is grounded, a gate of the third PMOS, the gate and source of the corresponding third NMOS, and the gate and source of the corresponding fourth NMOS receive a negative high voltage, and outputs of the corresponding word line switching unit are grounded.

More optionally, during over-erase operations:

in a word line switching unit corresponding to a selected word line, a source of the corresponding third PMOS is grounded, a gate of the third PMOS, a gate and source of the corresponding third NMOS, and a gate and source of the corresponding fourth NMOS receive a negative high voltage, and outputs of the corresponding word line switching unit are grounded;

in a word line switching unit corresponding to the unselected word line, sources of the corresponding third PMOS, third NMOS and fourth NMOS receive a negative high voltage, gates of the third PMOS, third NMOS and fourth NMOS receive a supply voltage, and the corresponding word line switching unit outputs a negative high voltage.

More optionally, when $\log_2 n$ is odd, $M=\log_2 \sqrt{n/8}$; when $\log_2 n$ is even, $M=\log_2 \sqrt{n/8}$.

To achieve the above and other related purposes, the present disclosure provides a memory, the memory comprising at least:

a memory array, a column decoding circuit, a readout circuit, and the row decoding circuit described above.

The word line decoding circuit is connected to word lines of the memory array, gating corresponding rows of the memory array based on address signals;

The column decoding circuit is connected to bit lines of the memory array, gating corresponding columns of the memory array based on the address signals;

The readout circuit is connected to the column decoding circuit to obtain corresponding data readout from the column decoding circuit.

As described above, the present disclosure has the following advantages:

The line decoding circuit and memory of the present disclosure is based on an innovative structure of the word line toggle switch signal generation module and word line toggle module, which effectively reduces the number of level conversion circuits in the word line decoding circuit, thereby greatly reducing the area occupied by the word line decoding circuit, further reducing the memory size and cost.

BRIEF DESCRIPTION OF THE DRAWINGS

FIG. 4 shows a truth table for a high/negative voltage toggle module of the present disclosure.

FIG. 5 shows a truth table of an address decoding module and a word line pre-decoding module of the present disclosure.

FIG. 6 shows a truth table for an address decoding module and a word line toggle switch signal generation module of the present disclosure.

FIG. 7 shows a truth table for a word line toggle switch signal generation module of the present disclosure.

REFERENCE NUMERALS

Figure 1:
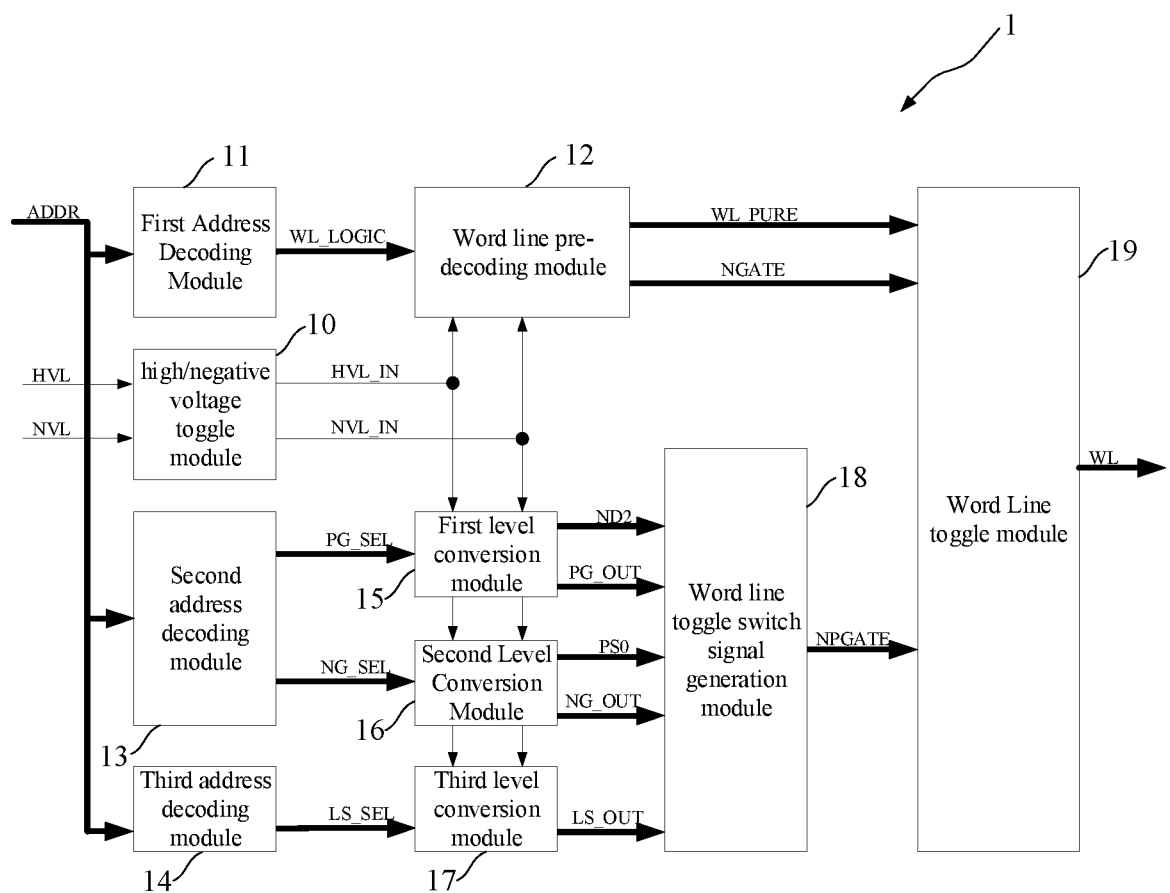
FIG. 1 shows a schematic diagram of a structure of a word line decoding circuit of the present disclosure.

1 Line decoding circuit
11 First address decoding module
12 Word line pre-decoding module
13 Second address decoding module
14 Third address decoding module
15 First level conversion module
16 Second Level Conversion Module
17 Third level conversion module
18 Word line toggle switch signal generation module
181 Word line toggle switch signal generation unit
19 Word Line toggle module
191 Word line switching unit
10 high/negative voltage toggle module
2 Column decoding circuit
3 Memory array
4 Readout circuit.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

Please refer to FIG. 1-FIG. 8. It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

Embodiment 1

As shown in FIG. 1, this embodiment provides a word line decoding circuit 1, the line decoding circuit 1 includes: a first address decoding module 11, a word line pre-decoding module 12, a second address decoding module 13, a third address decoding module 14, a first level conversion module 15, a second level conversion module 16, a third level conversion module 17, a word line toggle switch signal generation module 18, and a word line toggle module 19.

As shown in FIG. 1, the first address decoding module 11 receives first to Jth address signals and decoding them to obtain word line logic signals.

Specifically, in this embodiment, J=2, the first address decoding module 11 is a two-four decoder, the first address decoding module 11 receives the first and second address signals ADDR<1:0>, and decodes the first and second address signals ADDR<1:0> to obtain the 4 word line logic signals WL_LOGIC<3:0>. In application, the number of address decoding modules utilized can be set as needed.

As shown in FIG. 1, the word line pre-decoding module 12 is connected to outputs of the first address decoding module 11 to decode the word line logic signals based on voltage sources to obtain word line pre-decoding signals and first switch signals.

Specifically, in this embodiment, the word line pre-coding module 12 receives 4 word line logic signals WL_LOGIC<3:0>, and obtains 4 word line pre-coding signals WL_PRE<3:0> and 4 first switch signals NGATE<3:0> by pre-coding. The numbers of the word line pre-decoding signals and the first switch signals may be the same as the number of the word line logic signals, and can be adjusted according to actual needs, which are not described herein.

As shown in FIG. 1, the second address decoding module 13 receives (J+1)th to (M+2)th address signals and decodes them to obtain first selection signals and second selection signals.

Specifically, in this embodiment, $M=\log_2 \sqrt{n/8}$, at this point, $\log_2 n$ is an odd number, and the second address decoding module 13 receives 3rd to $(\log_2 \sqrt{n/8}+2)$th address signals ADDR<$\log_2 \sqrt{n/8}+1$:2> and decodes the 3rd to $(\log_2 \sqrt{n/8}+2)$th address signals ADDR<$\log_2 \sqrt{n/8}+1$:2> to obtain $\sqrt{n/8}$ first selection signals PG_SEL<$\sqrt{n/8}-1$:0> and $\sqrt{n/8}$ second selection signals NG_SEL<$\sqrt{n/8}-1$:0>. The number of the first selection signals and the second selection signals is $2^M$, and can be determined according to the value of M.

As shown in FIG. 1, the third address decoding module 14 receives (M+3)th to $(\log_2 n)$th address signals and decodes them to obtain third selection signals.

Specifically, in this embodiment, the third address decoding module 14 receives and decodes $(\log_2 \sqrt{n/8}+3)$th to $(\log_2 n)$th address signals ADDR<$\log_2 n$:$\log_2 \sqrt{n/8}+2$> to obtain $\sqrt{n/2}$ third selection signals LS_SEL<$\sqrt{n/2}-1$:0>. The number of the third selection signals is $2^{M+1}$, and can be determined according to the value of M.

As shown in FIG. 1, the first level conversion module 15 is connected to outputs of the second address decoding module 13 to convert the level of the first selection signals based on the low voltage source or the high voltage source to obtain first control signals and second control signals.

Specifically, in this embodiment, the first level conversion module 15 receives the first selection signals PG_SEL<$\sqrt{n/8}$–1:0> and obtains $\sqrt{n/8}$ first control signals ND2<$\sqrt{n/8}$–1:0> and $\sqrt{n/8}$ second control signals PG_OUT<$\sqrt{n/8}$–1:0> by level conversion. The number of the first control signals and the second control signals is the same as that of the first selection signals.

As shown in FIG. 1, the second level conversion module 16 is connected to outputs of the second address decoding module 13, wherein the second level conversion module performs level conversion on the second selection signals based on the low voltage source and/or the high voltage source to obtain third control signals and fourth control signals.

Specifically, in this embodiment, the second level conversion module 16 receives the second selection signals NG_SEL<$\sqrt{n/8}$–1:0> and obtains $\sqrt{n/8}$ third control signals PS0<$\sqrt{n/8}$–1:0> and $\sqrt{n/8}$ fourth control signals NG_OUT<$\sqrt{n/8}$–1:0> by level conversion. The number of the third control signals and the fourth control signals is the same as that of the second selection signals.

As shown in FIG. 1, the third level conversion module 17 is connected to outputs of the third address decoding module 14, wherein the third level conversion module performs level conversion on the third selection signals based on the low voltage source and/or the high voltage source to obtain fifth control signals.

Specifically, in this embodiment, the third level conversion module 17 receives the third selection signals LS_SEL<$\sqrt{n/2}$–1:0> and obtains by level conversion $\sqrt{n/2}$ fifth control signals LS_OUT<$\sqrt{n/2}$–1:0>. The number of the fifth control signals is the same as that of the third selection signals.

As shown in FIG. 1, the word line toggle switch signal generation module 18 is connected to outputs of the first level conversion module 15, the second level conversion module 16, and the third level conversion module 17, generating second switch signals based on the first control signals, the second control signals, the third control signals, the fourth control signals, and the fifth control signals Specifically, in this embodiment, the word line toggle switch signal generation module 18 includes n/4 word line toggle switch signal generation units 181 in order to generate n/4 second switch signals NPGATE<n/4–1:0>.

Figure 2:
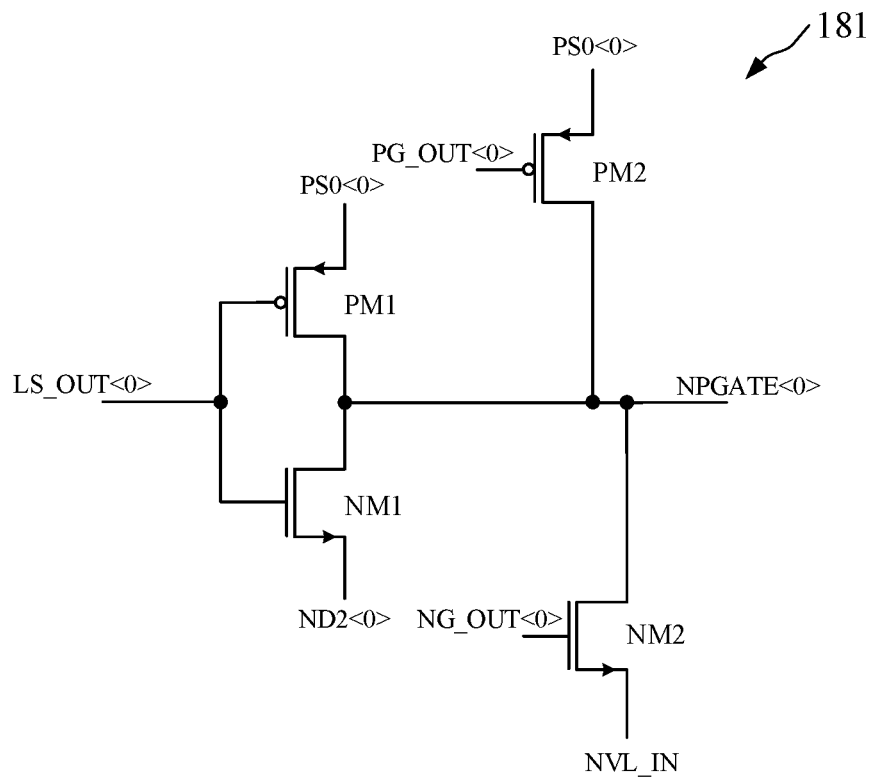
FIG. 2 shows a schematic diagram of a structure of a word line toggle switch signal generation unit of the present disclosure.

As shown in FIG. 2, as an example, the word line toggle switch signal generation unit 181 includes a first PMOS PM1, a second PMOS PM2, a first NMOS NM1, and a second NMOS NM2. Gates of the first PMOS PM1 and the first NMOS NM1 are connected to the fifth control signals (e.g., LS_OUT<0>), the source of the first PMOS PM1 is connected to the third control signals (e.g., PS0<0>), and the source of the first NMOS NM1 is connected to the first control signals (e.g., ND2<0>); the second PMOS PM2 has a source connected to the third control signals (e.g., PS0<0>), a gate connected to the second control signals (e.g., PG_OUT<0>), a drain connected to the first PMOS PM1 and to the drain of the first NMOS NM1; the second NMOS NM2 has a gate connected to the fourth control signals (e.g., NG_OUT<0>) and a source connected to the low voltage source NVL_IN; the drains of the first PMOS PM1, the second PMOS PM25, the first NMOS NM1, and the second NMOS NM2 are connected together and output second switch signals (e.g., NPGATE<0>).

Specifically, during programming and reading operations, the fifth control signals LS_OUT, the second control signals PG_OUT and the third control signals PS0 that correspond to the selected word line have a positive high voltage VH, and the first control signals ND2, the fourth control signals NG_OUT and the negative voltage source NVL_IN are grounded to GND; at this time the first PMOS PM1, the second PMOS PM2 and the second NMOS NM2 are turned off, the first NMOS NM1 is turned on, and the second switch signals NPGATE is grounded to GND. The third control signals PS0 corresponding to the unselected word lines have the positive high voltage VH, the fifth control signals LS_OUT, the second control signals PG_OUT, the fourth control signals NG_OUT and the negative voltage source NVL_IN are grounded to GND, and the first control signals ND2 is floating; at this time, the first NMOS NM1 and the second NMOS NM2 are turned off, the first PMOS PM1 and second PMOS PM2 are turned on, and the second switch signals NPGATE have the positive high voltage VH.

Specifically, during erase operations, the second control signals PG_OUT and the third control signals PS0 corresponding to the selected word line have the supply voltage VDD (positive voltage value), and the first control signals ND2, the fourth control signals NG_OUT, the fifth control signals LS_OUT and the negative voltage source NVL_IN have a negative high voltage VN; at this time, the first NMOS NM1, the second NMOS NM2, and the second PMOS PM2 are turned off, the first PMOS PM1 is turned on, and the second switch signals NPGATE has the supply voltage VDD. The fifth control signals LS_OUT and the fourth control signals NG_OUT corresponding to the unselected word lines have the supply voltage VDD, the second control signals PG_OUT and the negative voltage source NVL_IN have the negative high voltage VN, the first control signals ND2 and the third control signals PS0 are floating; at this time, the first PMOS PM1 is turned off, the first NMOS NM1, the second PMOS PM2 and second PMOS NM2 are turned on, and the output second switch signals NPGATE has the negative high voltage VN.

Specifically, during over-erase detection operations, the fifth control signals LS_OUT, the second control signals PG_OUT, and the third control signals PS0 corresponding to the selected word line have the supply voltage VDD, and the first control signals ND2, the fourth control signals NG_OUT and the negative voltage source NVL_IN are the negative high voltage VN; at this time, the first PMOS PM1, the second PMOS PM2 and the second NMOS NM2 are turned off, the first NMOS NM1 is turned on, and the second switch signals NPGATE have the negative high voltage VN. The third control signals PS0 corresponding to the unselected word lines have the supply voltage VDD, the fifth control signals LS_OUT, the second control signals PG_OUT, the fourth control signals NG_OUT, and the negative voltage source NVL_IN has the negative high voltage VN, and the first control signals ND2 for the float; at this time, the first NMOS NM1 and the second NMOS NM2 are off, the first PMOS PM1 and second PMOS PM2 are turned on, and the second switch signals NPGATE has the supply voltage VDD.

As shown in FIG. 1, the word line toggle module 19 is connected to outputs of the word line pre-coding module 12 and the word line toggle switch signal generation module 18, generating k word line signals based on the first switch signals and the second switch signals.

Figure 3:
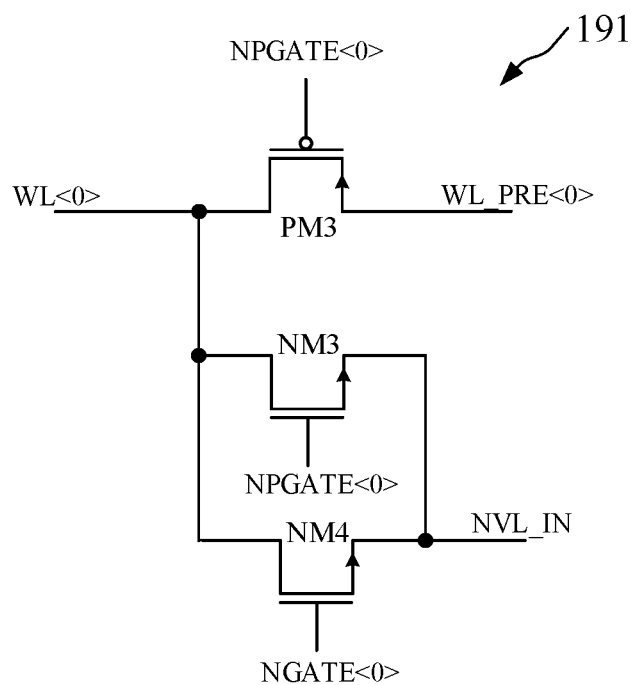
FIG. 3 shows a schematic diagram of a structure of a word line toggle module of the present disclosure.

Specifically, in this embodiment, the word line toggle module 19 comprises n (wherein, n=k) word line switching units 191 to generate n word line signals WL<n–1:0>. As shown in FIG. 3, as an example, each word line switching unit 191 includes a third PMOS PM3, a third NMOS NM3, and a fourth NMOS NM4. The third PMOS PM3 has a source connected to the word line pre-decoding signals (e.g., WL_PRE<0>) and a gate connected to the second switch signals (e.g., NPGATE<0>); the third NMOS NM3 has a source connected to the low voltage source NVL_IN and a gate connected to the second switch signals (e.g., NPGATE<0>); the fourth NMOS NM4 has a source connected to the low voltage source NVL_IN and a gate connected to the first switch signals (e.g., NGATE<0>); the third PMOS PM3, the third NMOS NM3, and the fourth NMOS NM4 have their drains connected together and output word line signals.

Specifically, during programming and reading operations, the word line pre-decoding signals WL_PRE corresponding to the selected word line have positive high voltage VH, the first switch signals NGATE, low voltage source NVL_IN, and the second switch signals NPGATE are grounded to GND; at this time, the third NMOS NM3 and the fourth NMOS NM4 are turned off, the third PMOS PM3 is turned on, and the selected word line WL has a positive high voltage VH.

Regarding the unselected word lines, there may be three cases. In the first case: the second switch signals NPGATE and word line pre-decoding signals WL_PRE are not selected, then the word line pre-decoding signals WL_PRE and low voltage source NVL_IN are grounded to GND, the second switch signals NPGATE and the first switch signals NGATE have positive high-voltage VH; at this time, the third PMOS PM3 is turned off, the third NMOS NM3 and the fourth PMOS NM4 are turned on, and the unselected word lines WL are grounded to GND.

In the second case: the second switch signals NPGATE are selected, the word line pre-decoding signals WL_PRE are not selected, the first switch signals NGATE have a positive high voltage VH, the second switch signals NPGATE, word line pre-decoding signals WL_PRE and low voltage source NVL_IN are grounded to GND; at this time the third PMOS PM3 and the fourth NMOS NM4 are turned on, the third NMOS NM3 is turned off, and the unselected word lines WL are grounded to GND.

In the third case: the second switch signals NPGATE are not selected, the word line pre-decode signals WL_PRE are selected, the second switch signals NPGATE and word line pre-decode signals WL_PRE have a positive high voltage VH, the first switch signals NGATE and low voltage source NVL_IN are grounded to GND; at this time, the fourth NMOS NM4 and the third PMOS PM3 are turned off, the third NMOS NM4 is turned on and the unselected word lines WL are grounded to GND.

Specifically, during erase operations, as an example, at least 4 word lines in the memory array are erased simultaneously as a unit. All word line pre-decoding signals WL_PRE are grounded to GND, the second switch signals NPGATE corresponding to the selected word lines have the supply voltage VDD, the first switch signals NGATE and the low voltage source NVL_IN have the negative high-voltage VN; at this time, the third PMOS PM3 and the fourth NMOS NM4 are turned off, the third NMOS NM3 is turned on, and the selected word line WL has the negative high voltage VN. The second switch signals NPGATE corresponding to the unselected word lines, the first switch signals NGATE, and the low voltage source NVL_IN have the negative high-voltage VN; at this time, the third NMOS NM3 and the fourth NMOS NM4 are turned off, the third PMOS PM3 is turned on, and the unselected word lines WL are grounded to GND.

Specifically, during over-erase detection operations, as an example, over-erase detection is simultaneously performed on at least 4 word lines in the memory array as a unit. The selected word line corresponding to the word line pre-decoding signals WL_PRE are grounded to GND, the first switch signals NGATE, the low voltage source NVL_IN and the second switch signals NPGATE have the negative high-voltage VN; at this time, the third NMOS NM3 and the fourth NMOS NM4 are turned off, the third PMOS PM3 is turned on, and the selected word line WL is grounded to GND. When corresponding to the unselected word lines, second switch signals NPGATE and first switch signals NGATE are connected to the supply voltage VDD, word line pre-decoded signals WL_PRE are connected to the negative high-voltage VN, and the low voltage source NVL_IN is connected to the negative high-voltage VN; at this time, the third NOMS NM3 and the fourth NMOS NM4 are turned on, the third PMOS PM3 is turned off, the unselected word lines WL have the negative high-voltage VN.

As an example, in this embodiment, the word line switching units 191 are divided into in groups of four, and word line switching units in a same group receive different word line pre-decoded signals and different first switch signals. In application, the signals received by each word line switching unit can be set as needed.

It should be noted that in this embodiment, $k=2^a$, then $k=n$; in application, if $k \neq 2^a$, then $n/2<k<n$; $n=2^a$, a is a natural number; the values of k, n can be set as needed. In this embodiment, if $\log_2 n$ is an odd number, then $M=\log_2 \sqrt{n/8}$, the number of the first selection signals, the second selection signals, the first control signals, the second control signals, the third control signals and the fourth control signals is $\sqrt{n/8}$, and the number of the third selection signals and the fifth control signals is $\sqrt{n/2}$. In application, in the case of $\log_2 n$ being an even number, $M=\log_2 \sqrt{n/4}$, the number of the first selection signals, the second selection signals, the first control signals, the second control signals, the third control signals, and the fourth control signals is $\sqrt{n/4}$, and the number of the third selection signals and the fifth control signals is $\sqrt{n/4}$.

As another implementation of the present disclosure, the line decoding circuit 1 further comprises a high/negative voltage toggle module 10, the high/negative voltage toggle module 10 receiving a positive voltage HVL and a negative voltage NVL, and setting a high voltage source HVL_IN and a low voltage source NVL_IN of corresponding voltage values based on the operation mode and outputting them. As an example, the positive voltage is provided by a high voltage charge pump and the negative voltage is provided by a negative voltage charge pump, and the value of the positive voltage may be about 5V~9.5V and the value of the negative voltage may be about −8V~−9.75V; the voltage values and the source of the positive and negative voltages can be adjusted as needed.

As shown in FIG. 4, in this embodiment, when in a programming or reading mode, the high voltage source HVL_IN has a positive high-voltage VH and the low voltage source NVL_IN is grounded to GND; when in an erase mode, the high voltage source HVL_IN is the supply voltage VDD and the low voltage source NVL_IN is the negative high-voltage VN; when in an over-erase detection mode, the high voltage source HVL_IN is the supply voltage VDD and the low voltage source NVL_IN is the negative high voltage VN. In application, the corresponding voltage values of the HVL_IN and NVL_IN can be set as needed in different modes.

The truth tables for modules of this embodiment are shown in FIGS. 5-7. As an example, when the first address decoding module 11 performs programming and reading operations, the selected WL_LOGIC is logic high (i.e., logic 1) and the unselected WL_LOGIC are logic low (i.e., logic 0); when performing erase operations, all WL_LOGIC are logic 0; when performing over-erase detection operations, the selected WL_LOGIC is logic 0 and the unselected WL_LOGIC are logic 1.

In the second address decoding module 13, when performing programming and reading operations, the selected PG_SEL and NG_SEL are both logic 1, the unselected PG_SEL are logic 0, and NG_SEL is logic 1; when performing erase operations, the selected PG_SEL and NG_SEL are both logic 1, and the unselected PG_SEL and NG_SEL are both logic 0; when performing over-erase detection operations, the selected PG_SEL and NG_SEL are both logic 1, the unselected PG_SEL are logic 0 and NG_SEL is logic 1.

When the third address decoding module 14 performs programming, reading and over-erase detection operations, the selected LS_SEL is logic 1 and the unselected LS_SEL are logic 0; when performing erase operations, the selected LS_SEL is logic 0 and the unselected LS_SEL are logic 1.

The first level conversion module 15 implements the following function: when the input logic is 0, PG_OUT is NVL_IN and PS0 is floating, when the input logic is 1, PG_OUT is HVL_IN and PS0 is NVL_IN.

The second level conversion module 16 implements the following function: when the input logic is 0, NG_OUT is HVL_IN and PS0 is floating, and when the input logic is 1, NG_OUT is NVL_IN and PS0 is HVL_IN. The third level conversion module 17 implements the following function: when the input logic is 1, LS_OUT is HVL_IN; when the input logic is 0, LS_OUT is NVL_IN.

The word line pre-decoding module 12 implements the following function: when performing reading and programming operations, if the input logic is 0, WL_PRE is NVL_IN and NGATE is HVL_IN, if the input logic is 1, WL_PRE is HVL_IN and NGATE is NVL_IN; when performing erase and over-erase detection operations, if the input logic is 0, WL_PRE is grounded to GND, NGATE is NVL_IN; if the input logic is 1, WL_PRE is NVL_IN, NGATE is HVL_IN.

The high/negative voltage toggle module 10 implements the following function: when performing erase and over-erase detection operations, HVL_IN is the supply voltage VDD and NVL_IN is the negative high voltage VN generated by the negative voltage charge pump; when performing programming and reading operations, HVL_IN is the positive high voltage VH generated by the positive high voltage charge pump and NVL_IN is grounded to GND.

The word line toggle switch signal generation module 18 implements the following function: when performing programming, reading and over-erase detection operations, the selected word line toggle switch NPGATE is NVL_IN, and the unselected word line toggle switch NPGATE is HVL_IN; when performing erase operations, the selected word line toggle switch NPGATE is HVL_IN, and the unselected word line toggle switch NPGATE is NVL_IN.

The word line toggle module 19 implements the following function: when performing programming and reading operations, the selected word line is HVL_IN and the unselected word lines are NVL_IN; when performing erase operations, the selected word line is the negative high voltage VN and the unselected word lines are grounded to GND; when performing over-erase detection operations, the selected word line is grounded to GND and the unselected word lines are negative high voltage VN. In application, the truth tables can be designed as needed.

In this implementation, only $2\times\sqrt{n/8}+\sqrt{n/2}$ level change circuits are required to generate the word line toggle switch signals (in the case of $\log_2 n$ being an even number, the number of level change circuits required is $2\times\sqrt{n/4}+\sqrt{n/4}$). The larger the product capacity, the more word line toggle switches are required, the greater the reduction in the number of level changeover circuits in the present disclosure compared to the conventional design, and the more significant the reduction in area.

Embodiment 2

Figure 8:
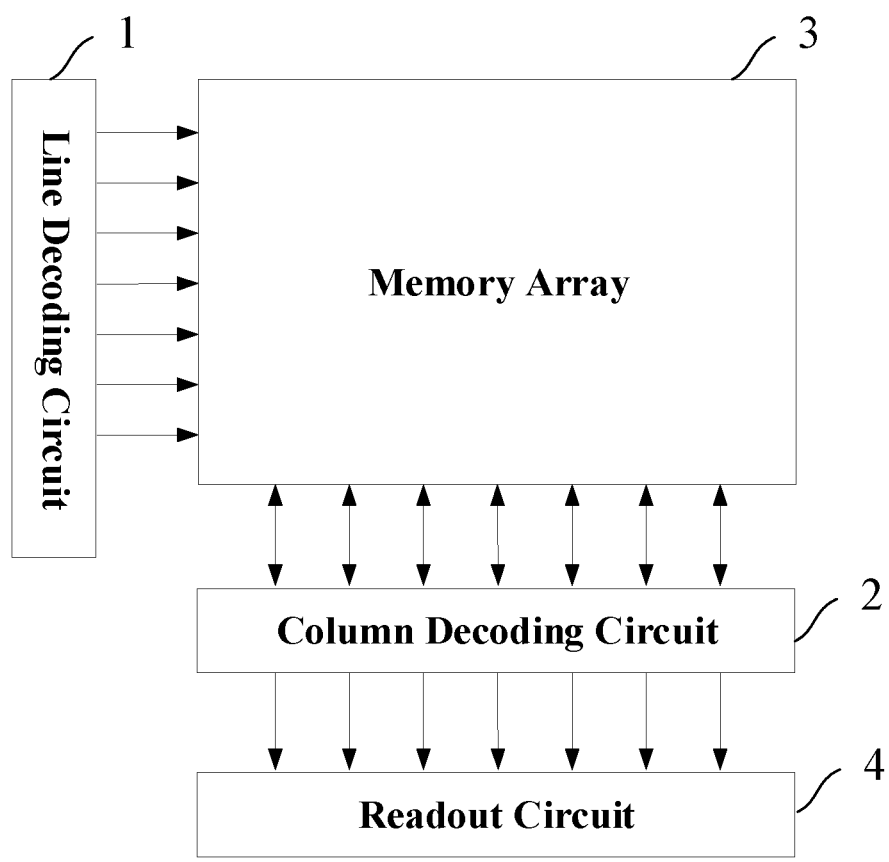
FIG. 8 shows a schematic diagram of a structure of a memory of the present disclosure.

As shown in FIG. 8, this embodiment provides a memory, the memory comprising. a word line decoding circuit 1, a column decoding circuit 2, a memory array 3, and a readout circuit 4.

As shown in FIG. 8, the row decoding circuit 1 is connected to word lines of the memory array 3, gating corresponding rows of the memory array 3 based on address signals. The structure and operating principle of the word line decoding circuit 1 are similar to the descriptions of Embodiment 1.

As shown in FIG. 8, the column decoding circuit 2 is connected to bit lines of the storage array 3 and selects corresponding columns of the storage array 3 based on the address signals. Any circuit structure that can implement line decoding is applicable to the present disclosure.

As shown in FIG. 8, the readout circuit 4 is connected to the column decoding circuit 2, and obtains corresponding data readout from the column decoding circuit 2. Any circuit structure that can achieve data readout is applicable to the present disclosure.

In summary, the present disclosure provides a word line decoding circuit and memory, including: a first address decoding module, receiving first to Jth address signals and decoding them to obtain word line logic signals; a word line pre-coding module, connected to outputs of the first address decoding module, decoding the word line logic signals based on a low voltage source or a high voltage source to obtain word line pre-coding signals and a first switch signal; and a second address decoding module, receiving (J+1)th to (M+2)th address signals and decoding them to obtain first selection signals and second selection signals; a third address decoding module, receiving (M+3)th to X address signals and decoding them to obtain third selection signals; a first level conversion module, connected to outputs of the second address decoding module, wherein the first level conversion module performs level conversion on the first selection signals based on the low voltage source and/or the high voltage source to obtain first control signals and second control signals; a second level conversion module, connected to outputs of the second address decoding module, wherein the second level conversion module performs level conversion on the second selection signals based on the low voltage source and/or the high voltage source to obtain third control signals and fourth control signals; a third level conversion module, connected to outputs of the third address decoding module, wherein the third level conversion module performs level conversion on the third selection signals based on the low voltage source and/or the high voltage source to obtain fifth control signals; a word line toggle switch signal generation module, connected to outputs of the first level conversion module, the second level conversion module, and the third level conversion module, generating second switch signals based on the first control signals, the second control signals, the third control signals, the fourth control signals, and the fifth control signals; a word line toggle module, connected to outputs of the word line pre-coding module and the word line toggle switch signal generation module, generating k word line signals based on the first switch signals and the second switch signals; wherein if k=$2^a$, then k=n; if k≠$2^a$, then n/2<k<n; n is a natural number greater than or equal to 1, a is a natural number, and J is a natural number between 1 and M+1.

The present disclosure can effectively reduce the number of level conversion circuits in the word line decoding circuit, thus greatly reducing the area occupied by the word line decoding circuit. Memory with larger capacity requires more word lines, so the effect of the present disclosure in reducing the area is more apparent in memory with larger capacity. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A line decoding circuit, wherein the line decoding circuit comprises at least:
   a first address decoding module, receiving first to Jth address signals and decoding them to obtain word line logic signals;
   a word line pre-coding module, connected to outputs of the first address decoding module, decoding the word line logic signals based on a low voltage source and/or a high voltage source to obtain word line pre-coding signals and first switch signals;
   a second address decoding module, receiving (J+1)th to (M+2)th address signals and decoding them to obtain first selection signals and second selection signals;
   a third address decoding module, receiving (M+3)th to ($\log_2$ n)th address signals and decoding them to obtain third selection signals;
   a first level conversion module, connected to outputs of the second address decoding module, wherein the first level conversion module performs level conversion on the first selection signals based on the low-voltage voltage source and/or the high-voltage voltage source to obtain first control signals and second control signals;
   a second level conversion module, connected to outputs of the second address decoding module, wherein the second level conversion module performs level conversion on the second selection signals based on the low voltage source and/or the high voltage source to obtain third control signals and fourth control signals;
   a third level conversion module, connected to outputs of the third address decoding module, wherein the third level conversion module performs level conversion on the third selection signals based on the low-voltage voltage source and/or the high-voltage voltage source to obtain fifth control signals;
   a word line toggle switch signal generation module, connected to outputs of the first level conversion module, the second level conversion module, and the third level conversion module, generating second switch signals based on the first control signals, the second control signals, the third control signals, the fourth control signals, and the fifth control signals, wherein the word line toggle switch signal generation module comprises a plurality of word line toggle switch signal generation units, each word line toggle switch signal generation unit comprising a first PMOS, a second PMOS, a first NMOS, and a second NMOS; and wherein the first PMOS and the first NMOS have gates connected to the fifth control signals, the first PMOS has a source connected to the third control signals, the first NMOS has a source connected to the first control signals, the second PMOS has a source connected to the third control signals, a gate connected to the second control signals a drain connected to drains of the first PMOS and the first NMOS; the second NMOS has a gate connected to the fourth control signals and a source connected to the low voltage source; and the drains of the first PMOS, the second PMOS, the first NMOS and the second NMOS are connected together and output switch signals; and
   a word line toggle module, connected to outputs of the word line pre-coding module and the word line toggle switch signal generation module, generating k word line signals based on the first switch signals and the second switch signals;
   wherein if k=$2^a$, then k=n; if k≠$2^a$, then n/2<k<n; wherein n=$2^a$, a is a natural number, J is a natural number between 1 and M+1, and M is any natural number.

2. The line decoding circuit according to claim 1, further comprising
   a high/negative voltage toggle module, wherein the high/negative voltage toggle module receives negative and positive voltages, and switches between outputting a high voltage and outputting a low voltage with corresponding voltage values based on operation modes.

3. The line decoding circuit according to claim 2, wherein the positive voltages range from 5V to 9.5V and the negative voltages ranges from −8V to −9.75V.

4. The line decoding circuit according to claim 1, wherein during programming and reading operations,
   in a word line toggle switch signal generation unit corresponding to a selected word line, gates of the corresponding first PMOS and first NMOS, a source of the corresponding first PMOS, and a gate and source of the second PMOS receive a positive high voltage, a source of the first NMOS, and a gate and source of the second NMOS are grounded, and outputs of the corresponding word line toggle switch signal generation unit are grounded; and
   in a word line toggle switch signal generation unit corresponding to an unselected word line, sources of the corresponding first PMOS and second PMOS receive a positive high voltage, gates of the corresponding first PMOS, first NMOS, and second PMOS, and a gate and source of the corresponding second NMOS are grounded, the source of the first NMOS is floating, and the corresponding word line toggle switch signal generation unit outputs a positive high voltage.

5. The line decoding circuit according to claim 1, wherein during erase operations,
   in a word line toggle switch signal generation unit corresponding to a selected word line, a source of the corresponding first PMOS, a source and gate of the corresponding second PMOS receive a supply voltage, a gate of the corresponding first PMOS and first NMOS, a source of the first NMOS, a gate and source of the corresponding second NMOS receive a negative high voltage, and the corresponding word line toggle switch signal generation unit outputs the supply voltage; and in a word line toggle switch signal generation unit corresponding to an unselected word line, gates of the corresponding first PMOS, first NMOS, and second NMOS receive the supply voltage, a gate of the corresponding second PMOS, a source of the second NMOS receive a negative high voltage, sources of the first PMOS, second PMOS, and first NMOS are floating, the corresponding word line toggle switch signal generation unit outputs a negative high voltage.

6. The line decoding circuit according to claim 1, wherein during over-erase detection operations, in a word line toggle switch signal generation unit corresponding to a selected word line, gates of the corresponding first PMOS, first NMOS, and second PMOS, sources of the first PMOS and the second PMOS receive a supply voltage, a source of the first NMOS, a gates and source of the corresponding second NMOS receive a negative high voltage, and the corresponding word line toggle switch signal generation unit outputs a negative high voltage; and in a word line toggle switch signal generation unit corresponding to an unselected word line, sources of the corresponding first PMOS and second PMOS receive a supply voltage, gates of the first PMOS, the corresponding first NMOS, and the second PMOS, and a gate and source of the corresponding second NMOS receive a negative high voltage, a source of the first NMOS is floating, the corresponding word line toggle switch signal generation unit outputs a supply voltage.

7. The line decoding circuit according to claim 1, wherein the word line toggle module comprises k word line switching units, each word line switching unit comprising a third PMOS, a third NMOS, and a fourth NMOS; and wherein the third PMOS has a source connected to the word line pre-decoding signals and a gate connected to the second switch signals, the third NMOS has a source connected to the low voltage source and a gate connected to the second switch signals, the fourth NMOS has a source connected to the low voltage source and a gate connected to the first switch signals, and drains of the third PMOS, the third NMOS, and the fourth NMOS are connected together and output word line signals.

8. The line decoding circuit according to claim 7, wherein during programming and reading operations, in a word line switching unit corresponding to a selected word line, a source of the corresponding third PMOS receives a positive high voltage, a gate of the third PMOS, a gate and source of the corresponding third NMOS, and a gate and source of the corresponding fourth NMOS are grounded, and the corresponding word line switching unit outputs a positive high voltage; and in a word line switching unit corresponding to an unselected word line, gates of the corresponding third PMOS, third NMOS, and fourth NMOS receive a positive high voltage, sources of the third PMOS, third NMOS, and fourth NMOS are grounded, and outputs of the corresponding word line switching unit are grounded; or, the gates and sources of the third PMOS and third NMOS, and the source of the fourth NMOS are grounded, the gate of the fourth NMOS receives a positive high voltage, the outputs of the corresponding word line switching unit output are grounded; or, the gate and source of the third PMOS, and the gate of the third NMOS receives a positive high voltage, the source of the third NMOS, and the gate and source of the fourth NMOS are grounded, and the outputs of the corresponding word line switching unit are grounded.

9. The line decoding circuit according to claim 7, wherein during erase operations, in a word line switching unit corresponding to a selected word line, a source of the corresponding third PMOS is grounded, the gate of the third PMOS, and the gate of the corresponding third NMOS receive a supply voltage, the source of the third NMOS, a gate and source of the corresponding fourth NMOS receive a negative high voltage, and the corresponding word line switching unit outputs a negative high voltage; and in a word line switching unit corresponding to an unselected word line, a source of the corresponding third PMOS is grounded, a gate of the third PMOS, the gate and source of the corresponding third NMOS, and the gate and source of the corresponding fourth NMOS receive a negative high voltage, and outputs of the corresponding word line switching unit are grounded.

10. The line decoding circuit according to claim 7, wherein during over-erase detection operations, in a word line switching unit corresponding to a selected word line, a source of the corresponding third PMOS is grounded, a gate of the third PMOS, a gate and source of the corresponding third NMOS, and a gate and source of the corresponding fourth NMOS receive a negative high voltage, and outputs of the corresponding word line switching unit are grounded; and in a word line switching unit corresponding to the unselected word line, sources of the corresponding third PMOS, third NMOS and fourth NMOS receive a negative high voltage, gates of the third PMOS, third NMOS and fourth NMOS receive a supply voltage, and the corresponding word line switching unit outputs a negative high voltage.

11. The line decoding circuit according to claim 1, wherein when $\log_2 n$ is odd, $M=\log_2 \sqrt{n/8}$; when $\log_2 n$ is even, $M=\log_2 \sqrt{n/4}$.

12. A memory, wherein the memory comprises at least:

a memory array, a column decoding circuit, a readout circuit, and a word line decoding circuit as claimed in claim 1;

wherein the word line decoding circuit is connected to word lines of the memory array, gating corresponding rows of the memory array based on address signals;

wherein the column decoding circuit is connected to bit lines of the memory array, gating corresponding columns of the memory array based on the address signals; and wherein the readout circuit is connected to the column decoding circuit to obtain corresponding data readout from the column decoding circuit.

* * * * *